United States Patent
Wang et al.

(10) Patent No.: US 6,765,444 B2
(45) Date of Patent: Jul. 20, 2004

(54) CROSS CLOCKED LOCK DETECTOR CIRCUIT FOR PHASE LOCKED LOOP

(75) Inventors: David Y. Wang, San Jose, CA (US); Jyn-Bang Shyu, Cupertino, CA (US)

(73) Assignee: Neoaxiom Corporation, San Jose, CA (US)

( * ) Notice: Subject to any disclaimer, the term of this patent is extended or adjusted under 35 U.S.C. 154(b) by 33 days.

(21) Appl. No.: 10/299,313

(22) Filed: Nov. 18, 2002

(65) Prior Publication Data

US 2004/0095197 A1 May 20, 2004

(51) Int. Cl.$^7$ .................................................. H03L 7/00
(52) U.S. Cl. ....................... 331/17; 331/25; 331/DIG. 2
(58) Field of Search ........................... 331/17, 25, 1 A, 331/27, DIG. 2; 327/40, 12, 47, 142, 3, 7

(56) References Cited

U.S. PATENT DOCUMENTS

| | | | |
|---|---|---|---|
| 5,008,635 A | | 4/1991 | Hanke et al. ................ 331/1 A |
| 5,126,690 A | * | 6/1992 | Bui et al. .................... 331/1 A |
| 5,180,933 A | * | 1/1993 | Krzyzanowski ................ 327/7 |
| 5,719,508 A | * | 2/1998 | Daly ............................ 327/12 |
| 5,909,130 A | * | 6/1999 | Martin et al. ................. 327/12 |
| 5,942,948 A | * | 8/1999 | Smith et al. ................... 331/8 |
| 6,177,842 B1 | | 1/2001 | Ahn et al. .................. 331/1 A |
| 6,229,864 B1 | | 5/2001 | DuFour ....................... 375/375 |
| 6,314,150 B1 | | 11/2001 | Vowe .......................... 375/374 |
| 6,320,469 B1 | | 11/2001 | Friedberg et al. ........... 331/1 A |
| 6,411,130 B1 | | 6/2002 | Gater .......................... 327/12 |

* cited by examiner

Primary Examiner—Robert Pascal
Assistant Examiner—Joseph Chang
(74) Attorney, Agent, or Firm—Thomas Schneck; David M. Schneck

(57) ABSTRACT

A method and a lock detector circuit for phase-locked loop for detecting lock between reference signal and a feedback signal in two phases: lock detection phase and lock assertion phase. The detector circuit comprises delay circuits coupled to a first, a second D flip flops, an OR logic gate, and an AND gate. In the lock detection, the lock detector circuit compares the phases of the reference input clock with the feedback clock. If the phases of these clocks are different or not within a window of tolerance, the sample clock outputs of the first and second D flip flops are different. This condition causes the logic gate to issue a reset signal to the divide-by-64 counters. As such, the lock detection signal is low, indicating the PLL is not in lock condition. In the lock assertion phase, if the two phases are the same or within the window of tolerance, the sample clock outputs of the first and second D flip flops are the same or both low at the same time. This condition causes the logic gate to issue an enabling signal to the divide-by-64 counters. The divide-by-64 counter starts to count to full cycle and then the lock detect signal is high, indicating the PLL is in locked condition.

11 Claims, 6 Drawing Sheets

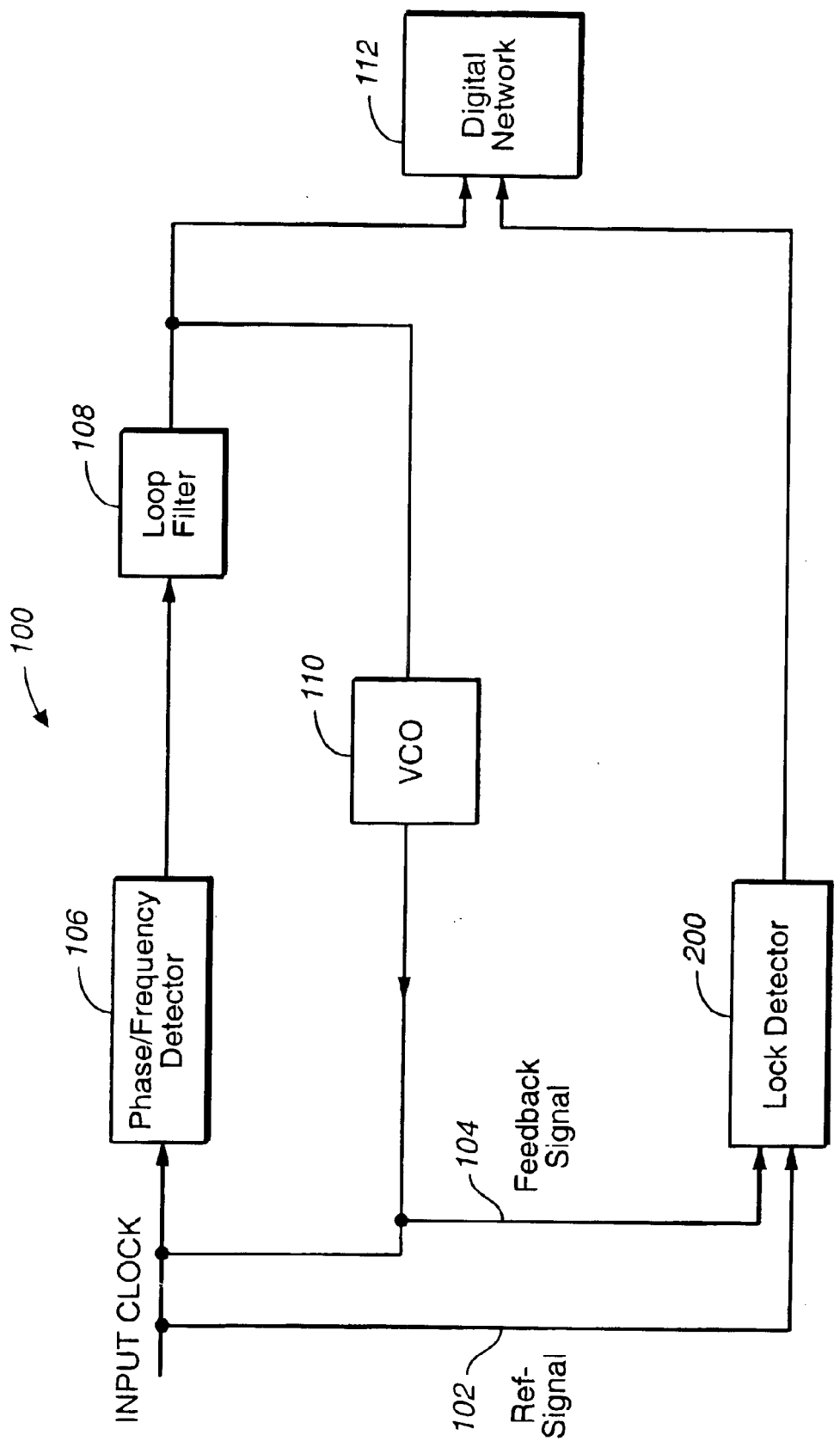
FIG._1

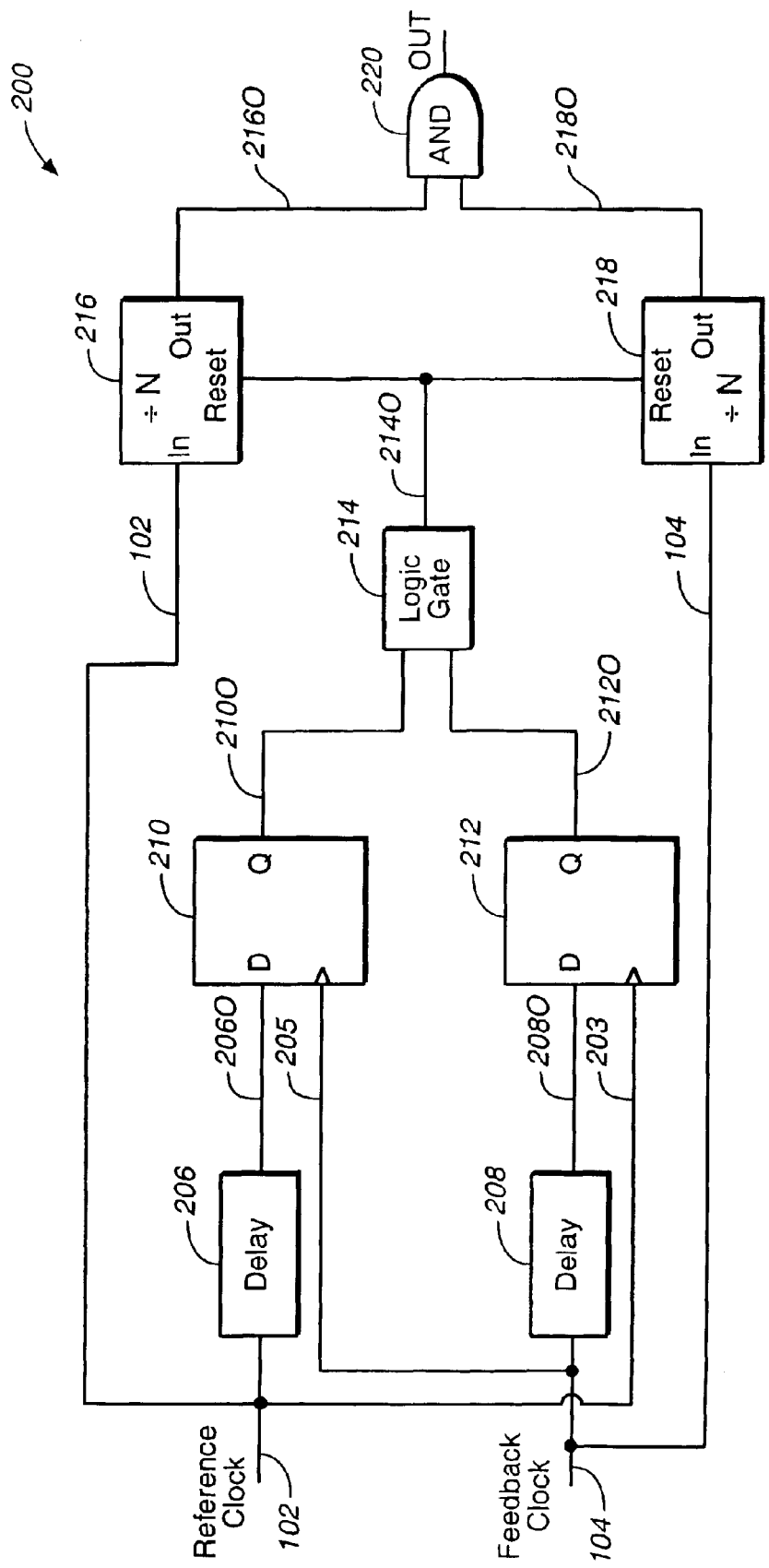
FIG._2

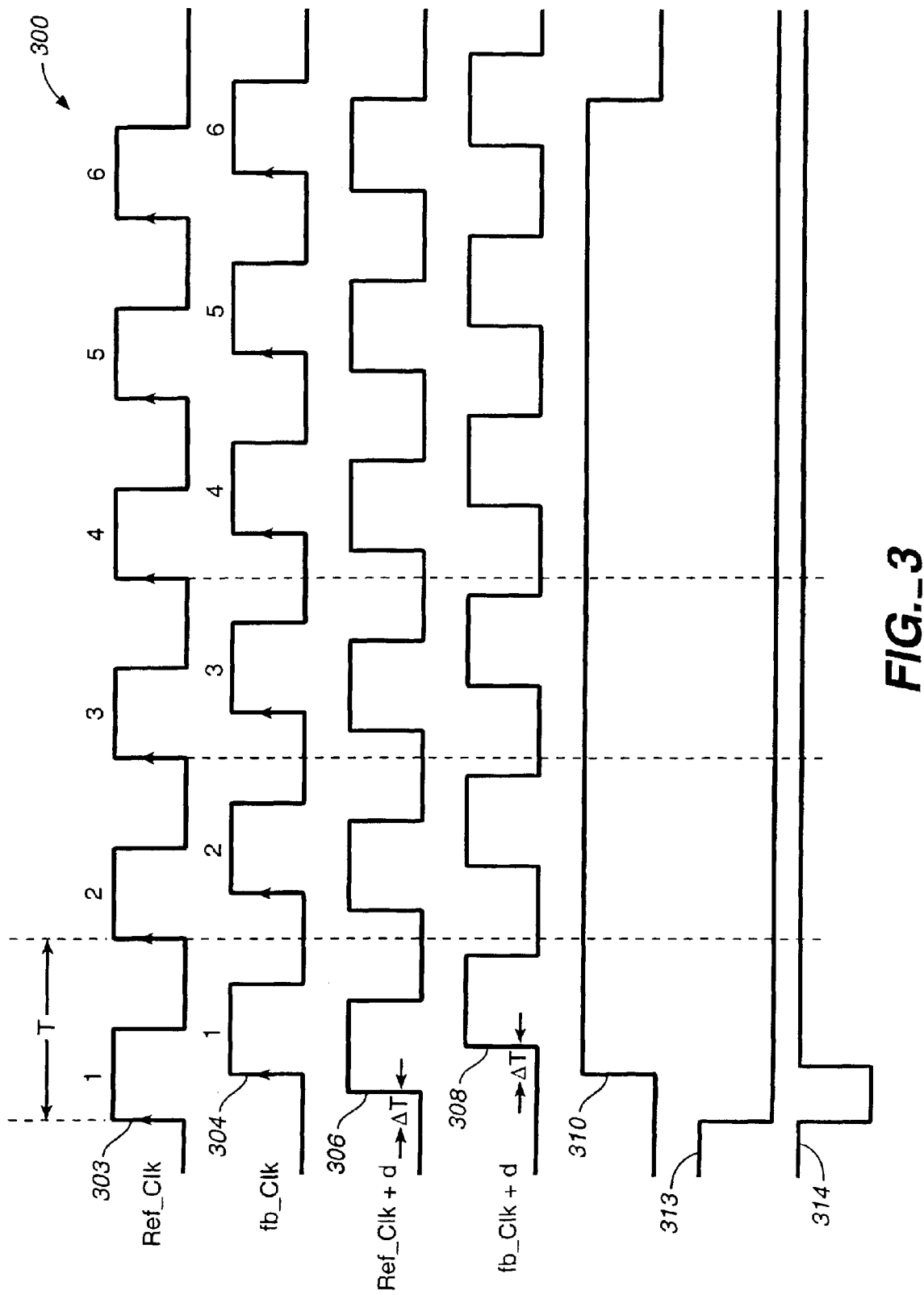
FIG._3

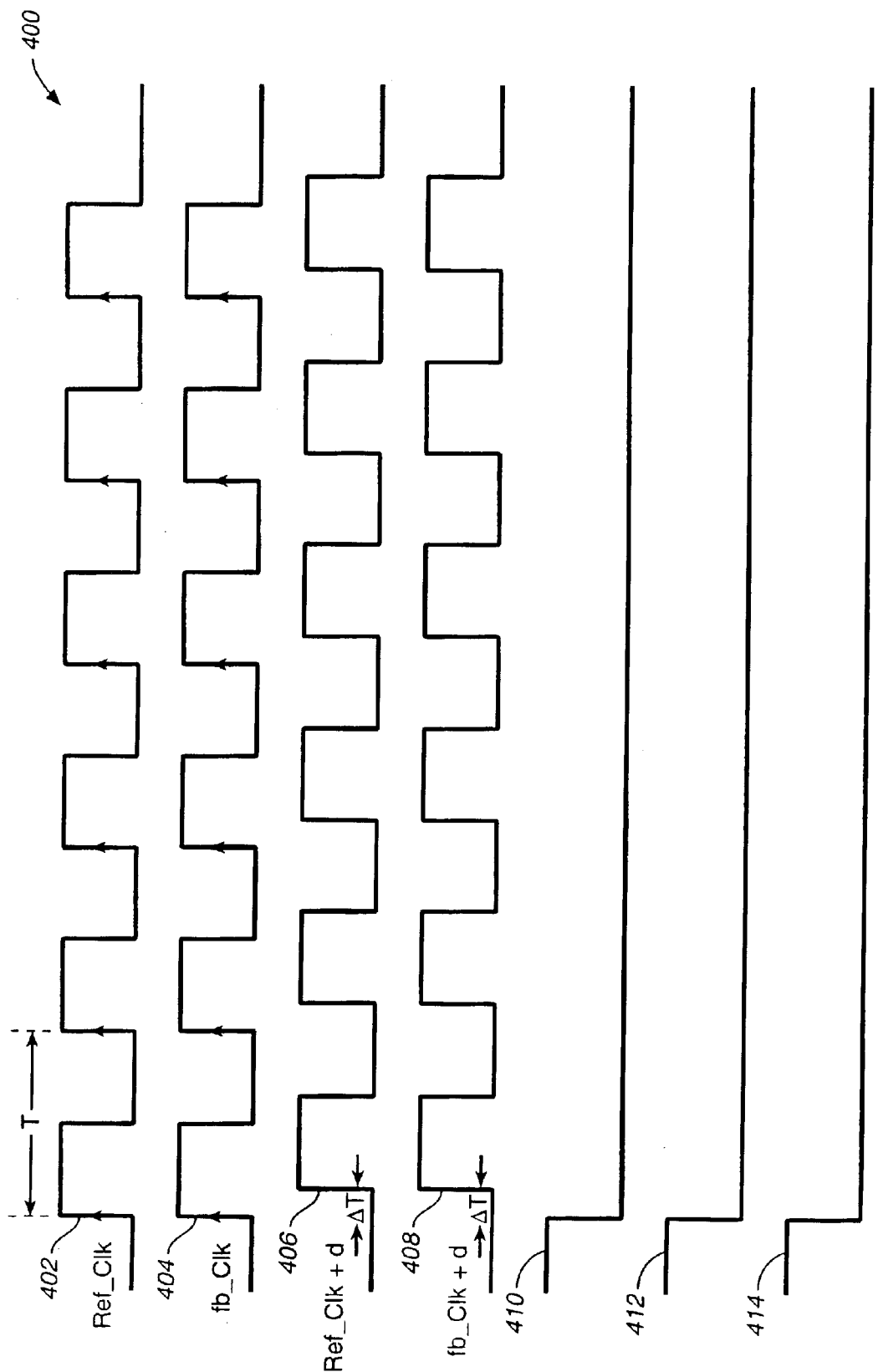
FIG._4

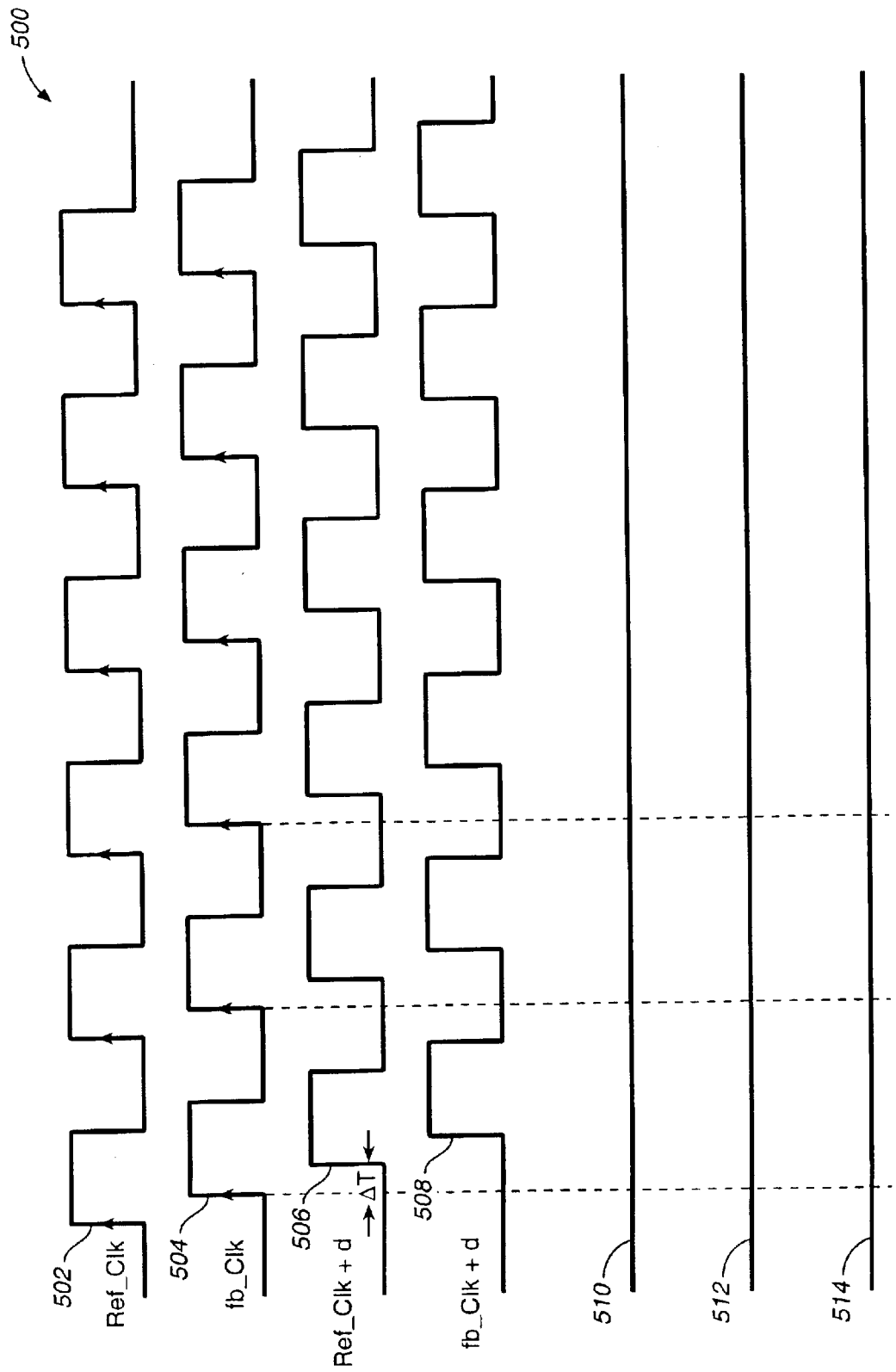
FIG._5

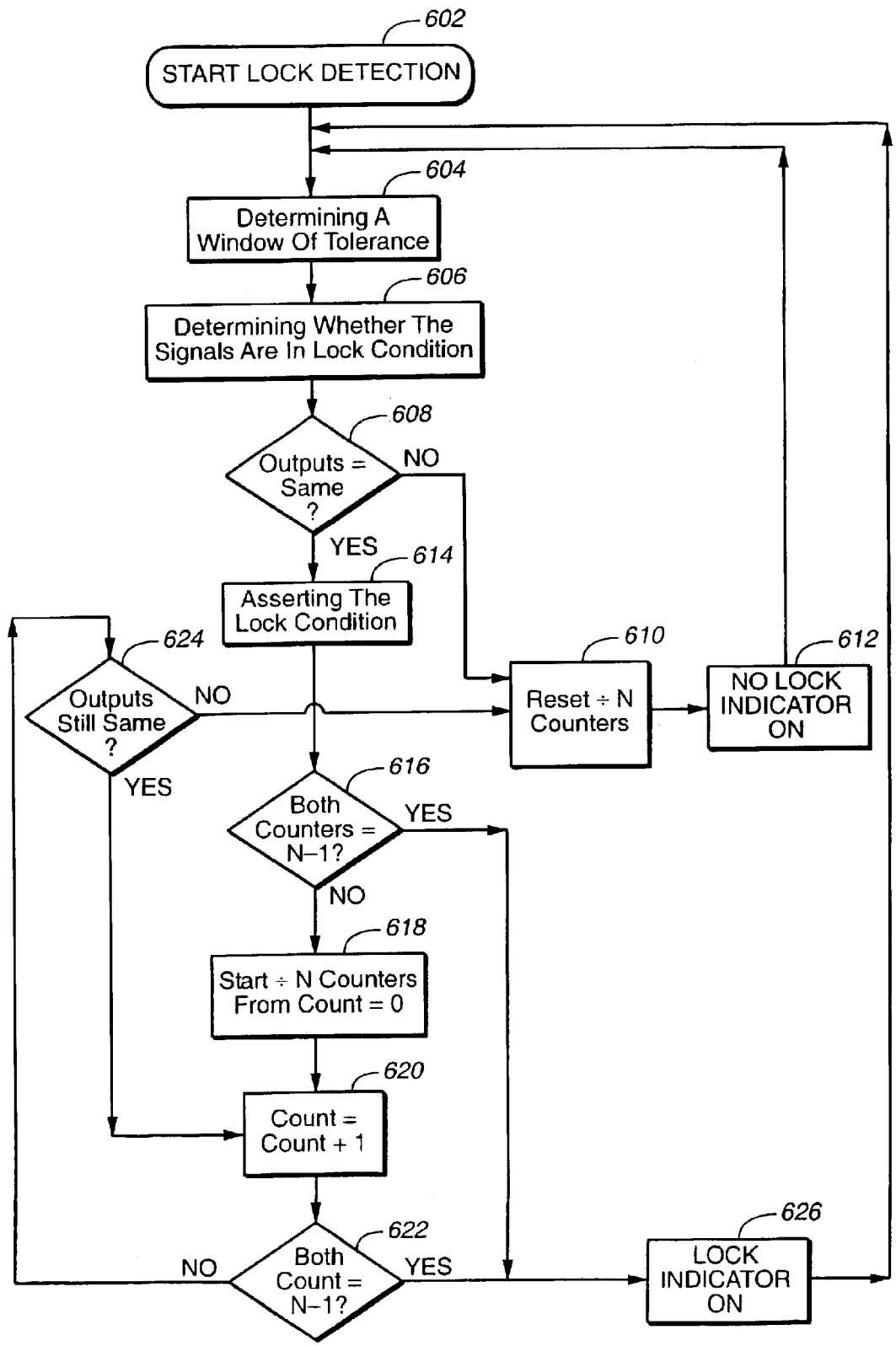
FIG._6

CROSS CLOCKED LOCK DETECTOR CIRCUIT FOR PHASE LOCKED LOOP

TECHNICAL FIELD

The invention relates to lock detector circuits in phase locked loop circuits.

BACKGROUND ART

Phase locked loop circuits have played important roles in electronic systems since the early 1930's. A phase locked loop (PLL) is a feedback circuit which may comprise a phase detector or comparator, a loop filter, and a voltage controlled oscillator (VCO). The phase detector receives and compares either phase or frequency of an incoming reference signal with a sample of the feedback signal. The loop filter removes high frequency components of the phase difference between the two signals. The low frequency components of the difference in phase or frequency of the two signals drives the VCO to produce a new sample of the feedback signal which is better matched in frequency or phase with the reference signal. This process continues until both signals are in a locked condition. Therefore, the PLL can lock the phase or frequency of a reference signal into a fixed phase or frequency. Because of this capability, PLL circuits are useful in many applications such as frequency synthesizers, reference local oscillators, and particularly as stable reference clocks. PLL circuits have been applied in diverse circuits, such as circuits to eliminate noise that causes phase jitter in a signal.

In order to achieve lock, a PLL circuit can take an unpredictable and unspecific amount of time. Therefore, there is a need to know whether and when lock has occurred, or when it is safe to assume that the PLL has achieved lock. Knowledge about the locked condition can provide important information for more efficient system design. For example, in network systems that use a PLL circuit to generate the system clocks, a lock detection signal may be used to design the timing arrangement of other components in the network system. Lock indication also helps in the design of loop filters to reject noise and other interfering signals.

One technique for designing a lock detector circuit is described by the U.S. Pat. No. 6,320,469 entitled "Lock Detection for Phase-Locked Loop" to Friedberg et al. ('469 patent). The '469 patent discloses a method and lock detector for lock between a reference signal and a feedback signal of a phase-locked loop (PLL) circuit. The '469 patent achieves lock detection by counting the number of cycles of both signals. If both signals are in a locked relation, the number of counts in an interval is the same. Otherwise, the number of complete cycles within an interval cannot be the same. There are two counters disclosed in the '469 patent. One counter counts the number of clock cycles of the feedback signal and another counter counts the number of clock cycles of the reference signal in an interval. The feedback comparator determines whether the counted number of cycles is within an expected range. The qualification counter repeats the counting several times to make sure the same number of cycles has been achieved.

An object of the invention is to achieve a cost effective and reliable PLL's lock detector circuit.

Another object of the present invention is to achieve a method of detecting the lock condition of a phase locked loop.

SUMMARY OF THE INVENTION

The above objects are achieved by means of a lock detection circuit for a phase locked loop (PLL) circuit. The lock detector circuit determines whether the PLL circuit is in lock condition in two stages. In the first stage, the lock detector circuit compares the phase of two clocks associated with the phase locked loop circuit, namely, a reference clock signal and a feedback clock signal to observe whether the phases of these two signals are in-phase or within a window of tolerance. The comparison of phases is established by a pair of cross-coupled flip-flop circuits having delayed inputs and outputs. In the second stage, the lock detector asserts the lock condition. The logic gate asserts whether the outputs to the flip-flop circuits are in lock condition after a certain number of counts have been established by a pair of counters. If the phases of the reference clock and the feedback clock are outside of the window of tolerance, a pair of counters is repeatedly reset and does not establish an output signal. However, if the phases of the two signals are in-phase or inside the window of tolerance, the counters are enabled and succeed in establishing an output signal. In other words, the counters count to full cycle and then go HIGH to assert that a locked relation has been achieved.

BRIEF DESCRIPTION OF THE DRAWINGS

FIG. 1 is the schematic diagram of a lock detector circuit of the present invention used in a phase locked loop digital system.

FIG. 2 is the block diagram of a lock detector circuit for a phase locked loop according to the present invention, as used in the phase locked loop digital system of FIG. 1.

FIG. 3 is a set of timing diagrams of the phase locked loop's detection circuit of FIG. 2 when the signals are not in locked relation.

FIG. 4 is another set of timing diagrams of the phase locked loop's detector circuit of FIG. 2 when the signals are in locked relation.

FIG. 5 is a set of timing diagrams of the lock detector circuit of FIG. 2 when the signals are out-of-phase but within the window of tolerance.

FIG. 6 is a flow chart of the method of detecting lock of a reference signal and a feedback signal used in the circuit shown in FIG. 2.

DETAILED DESCRIPTION OF THE PREFERRED EMBODIMENT

Referring now to FIG. 1, a phase locked loop digital system 100 that uses a phase locked loop to generate system clock is shown. The PLL with lock detector circuit 100 comprises a phase detector 106, a loop filter 108, a voltage controlled oscillator (VCO) 110, a lock detector circuit 200, and a digital network 112.

The phase detector 106 receives and compares the phase of a reference signal sample 102 with that of a feedback signal sample 104. The loop filter 108 removes unimportant components of the phase error of two signals. The difference in phase of the two signals drives the VCO 110 to produce a new feedback signal 104 which is better matched in phase with the reference signal 102. The lock detector circuit 200 samples the reference signal 102 and the feedback signal 104 to find when these two signals are in lock condition. The process of lock detection in the lock detector circuit 200 will be described in detail below. The whole process continues until both signals have the same phase or within a window of tolerance. Therefore, when this happens, the lock condition is achieved and the lock indicator is set high. The lock indicator signal and the PLL's output clock are fed to the digital network 112. The digital network 112 can be a frequency synthesizer, or a CPU well-known in the art.

With reference to FIG. 2, a phase locked loop's (PLL) lock detector circuit 200 samples a reference clock 102 and a feedback clock 104 signals as inputs for a lock detection process. The lock detection process of the lock detector 200 comprises two stages: a lock detection phase and a lock assertions phase. In the lock detection phase, the lock detector circuit 200 comprises a first delay circuit 206 coupled to a first D flip flop 210 and a second delay circuit 208 coupled to a second D flip flop 212. In a preferred embodiment, the amount of delay is less than one half of the period of the signals 102 and 104. The lock detector circuit 200 cross-couples the input clocks 102 and 104 as clocks of the first D flip flop 210 and the second D flip flop 212 by connecting the reference signal 102 to the clock terminal of the second D flip flop 112 via line 203 and connecting the feedback signal 104 to the clock of the first D flip flop 110 via line 205. This connection is also known as cross clocking the D flip flops. The output 2100 of the first D flip flop 210 and the output 2120 of the second D flip flop 212 are coupled to the input terminals of a logic gate 214. In a preferred embodiment, the logic gate 214 is an OR gate because with the lock detector circuit 200 connected as described above, with the logic characteristics of the D flip-flop circuits 210 and 212, and with the delay less than one half the period of the signal samples, the lock detector 200 must have the output of both D flip-flop circuits 210 and 212 the same LOW for locked condition. However, when the lock detector 200 employs other types of flip flops in place of the D flip flops 210 and 212 and the delay is extended more than one half of the signal's period so that their outputs can both go HIGH when both signals are in locked condition, an exclusive OR (XOR) gate can be used.

In the lock assertion phase, the reference clock signal 102 is an input to a first divide-by-N counter 216, and the feedback clock signal 104 is an input to a second divide-by-N counter 218. The output 2140 of the OR logic gate 214 is coupled to reset terminals of the divide-by-N counter 216 and the divide-by-N 218 for resetting the counters 216 and 218 when the reference signal 102 and the feedback signal 104 are not in lock condition. A lock condition is defined as when the reference clock signal 102 and the feedback signal 104 are either in phase or in a window of tolerance set by the delay circuits 206 and 208. The output 2160 of the divide-by-N counter 216 and the output 2180 of the divide-by-N counter 218 are coupled to the input terminals of the logic AND gate 220. The output of the AND gate 220 is coupled to the output of the PLL's lock detector circuit 200. In a preferred embodiment, the divide-by-N counters 216 and 218 are divide-by-64 counters.

In the lock detection phase, the PLL's lock detector circuit 200 compares the phase of the reference clock signal 102 with the phase of the feedback clock signal 104. If the phases of these clocks are not in lock condition, the sample clock outputs of the first and second D flip flops 210 and 212, i.e., the Q terminal outputs, can not have the same LOW value at the same time. This condition causes the divide-by-64 counters 216 and 218 to be reset because the OR gate 2140 output is high, making the lock detect signal is low, indicating the PLL is not in lock condition. In the lock assertion phase, if the two phases are in the lock condition defined above, the outputs of the D flip flops 210 and 212 have the same LOW value. The OR output is LOW and the divide-by-64 counters 216 and 218 are not reset and the lock detect signal is HIGH after the counters reach the full count indicating the PLL is in lock condition.

The first and second D flip flop 210 and 212 are positive-going transitions (PGT) flip flops. A PGT D flip flop latches out the value of its input at the rising edge of the clock signal. In the present application, the input signal of the first D flip flop 2060 is the reference signal 102 delayed by a small finite amount, $\Delta T$. In a preferred embodiment, $\Delta T$ is less than one half clock period. The clock for this flip flop is the feedback signal 104. The first D flip flop 210 latches out the value of the reference signal 102 at the rising edge of the feedback clock 205. Similarly, the input signal to the second D flip flop 212 is the feedback signal 104 delayed by the same finite amount $\Delta T$ as the reference signal 102. The finite amount $\Delta T$ defines the window of tolerance. The clock input of the second D flip flop 212 is the reference signal 203. The second D flip flop 212 latches out the value of the feedback signal 104 at the rising edge of the reference signal clock 102.

The outputs of the cross clocking of the D flip flops 210 and 212 are detected by the OR gate 214. An OR gate produces a HIGH output whenever either one or both of the two outputs are set high. Therefore, the OR detector 214 produces a HIGH output when both the output 2100 of the first D flip flop 210 and the output 2120 of the second D flip flop 212 are different and not equal to low at the same time. The HIGH output of the OR 214 issues a resetting signal to reset the divide-by-64 counters 216 and 218. The outputs 2160 and 2180 of the divide-by-64 counter 216 and 218 respectively are both LOW. And as a result, the output of the AND gate 220 is zero, which is the non-lock condition.

On the other hand, when the output 2100 of the first D flip flop 210 and the output 2120 of the second D flip flop 212 are the same and equal to LOW at the same time, the OR gate 214 produces a LOW output or an enabling signal output. As a result, the divide-by-64 counters 216 and 218 are not reset and start to count. The divide-by-64 counters 216 and 218 count to full cycle and become HIGH. The output of the AND gate 220 is HIGH, which is the lock condition. Thus, the OR gate 214 and the counters 216 and 218 successfully assert the lock condition.

In summary, when the outputs of the first D flip flop 210 and the second D flip flop 212 are the same, the reference signal 102 and the feedback signal 104 are in lock condition. When the outputs of the first D flip flop 210 and the second D flip flop 212 are different, i.e., one is LOW and the other is HIGH, the reference signal 102 and the feedback signal 104 are not in lock condition.

The lock condition is asserted by a logic gate 214 and a pair of counters 216 and 218. The logic gate 214 receives the outputs of the D flip flops 210 and 212 and produces an enabling signal to cause the counters 216 and 218 to count from a lowest value to the highest value. Afterward, the counters 216 and 218 produce a HIGH signal to signal a lock condition has been achieved.

The best way to understand how the lock detection circuit 200 of the present invention works is to examine the timing diagrams of all the signals used therein. With reference to FIG. 3, the timing diagrams of different signals of the PLL's lock detector circuit 200 are shown when the PLL is not in lock condition. A graph 303 shows the timing diagram of the reference clock signal 102 of a phase locked loop coupled to the detection circuit 200 for lock detection as shown in FIG. 2. Graph 304 shows the timing diagram of the feedback clock signal 104 as shown in FIG. 1. In the graphs 303 and 304, the signals are not in phase or within the window of tolerance defined by the delay circuits 206 and 208, i.e., they are not in lock condition. Graph 306 shows the timing diagram of the output of the first delay circuit 206. The reference clock signal is delayed by an amount $\Delta T$, less than half of the clock period T from the rising edge of the input signal. Similarly, graph 308 shows the timing diagram of the delayed feedback clock signal at the output of the second delay circuit 308. The delay circuits 206 and 208 set the window of tolerance for lock condition. The window of tolerance is defined by the amount of delay ΔT set by the delay circuits 206 and 208. If the phases of the two signals 102 and 104 are in-phase or within the window of tolerance, the lock condition is established by the lock detector 200.

Graph 310 of FIG. 3 shows the timing diagram of the Q output of the first D flip flop 210. The first D flip flop 210 latches out the value of the delayed reference signal 102 at the positive-going transition (PGT) of the feedback clock 104. In other words, for a PET D flip flop 210, Q(n+1) is equal to Q(n) at the positive-going transitions of the clock signal. Looking at the timing diagrams 304, the positive-going transitions or rising edge of the feedback signal clock 104 starts when the delayed reference signal 102 shown in graph 306 is at HIGH value. And this is true for all the rising edges of the clock of the first D flip flop 210. Therefore, the timing diagram 310 starts to go HIGH at the first rising edge of the clock 204.

Similarly, the graph 313 of FIG. 3 shows a timing diagram of the output 2120 of the second D flip flop 212. The second D flip flop 212 latches out the value of the delayed feedback signal 104 at the positive-going transitions or rising edge of the reference clock 102. In other words, for the second D flip flop 212, Q(n+1) is equal to Q(n) at the rising edge of the clock signal. Looking at the timing diagrams 303, the rising edge of the reference signal 102 starts when the delayed feedback signal 2080 is at LOW value. And this is true for all rising edges of the clock of the second D flip flop 212. Therefore, the timing diagram 313 starts to go LOW at the first rising edge of the reference clock 102. Because the outputs of the first D flip flop 210 and the second D flip flop 212 are different, one is HIGH as in diagram 310, the other is LOW as in diagram 313, the OR gate 214 must go HIGH.

Now referring to the timing diagram 314 of FIG. 3, because the timing diagrams 310 and 313 are not in phase, the OR gate 214 detects the HIGH outputs between the outputs on lines 2100 and 2120 and the output on line 2140 is HIGH. The HIGH output of the OR gate 214 as shown in the diagram 314 resets both divide-by-64 counters 216 and 218. As a result, the output of the AND gate 220 is low, indicating that the phase locked loop is not in lock condition. Thus, when the reference signal and the feedback signal are not in the lock condition, the outputs of the cross-clocked D flip flops are not the same, e.g., one is HIGH the other is LOW. This causes the output of the logic OR gate goes HIGH, resetting the counters.

Now referring to FIG. 4, timing diagrams of the lock detector circuit 200 when the phase lock loop is in lock condition are shown. The timing diagrams 402 and 404 of the respective reference signal 102 and the feedback signal 104 are in-phase. Both of these signals are delayed by the same amount after the delay circuits 206 and 208 respectively. Therefore, the timing diagram 406 of the delayed reference signal and the timing diagram 408 of the delay feedback signal are still in-phase.

Referring to graph 410, the timing diagram of the output of the first clock D flip flop 210 shows that the rising edge of the feedback signal 104 starts when the delayed reference signal 2060 is LOW. This is true for all the positive-going transitions of the clock of the first D flip flop 210. Therefore, the timing diagram 410 starts to go LOW at the first rising edge.

Referring to graph 412, the timing diagram of the output of the second clock D flip flop 212 shows that the rising edge of the reference signal 102 starts when the delayed feedback signal 2080 is LOW. This is true for all the positive-going transitions of the clock of the second D flip flop 212. Therefore, the timing diagram 412 starts to go LOW at the first rising edge and remains LOW thereafter. Because the outputs of the first D flip flop 210 and second D flip flop 212 are the same, both are LOW as shown in diagrams 410 and 412 above, the output to the OR gate 214 must be LOW, enabling the counters.

Graph 414 shows the timing diagram of the output of the OR gate 214. Because the output on line 2100 of the first D flip flop 210 is LOW and the output on line 2120 of the second D flip flop 212 is also LOW, the output on line 2140 of the OR logic gate 214 is LOW. When the reset is LOW, both divide-by-64 counters 216 and 218 start to count up the frequency of the reference signal 102 and the feedback signal 104 from 0 to 63. After both counters reach the full count, if there is no reset signal asserted, the outputs of the counters will stay HIGH. Both inputs of the AND gate 220 are HIGH which will cause the output of AND gate 220 to set HIGH. The lock detection signal asserts the PLL is in lock condition.

Similarly, FIG. 5 shows the timing diagrams of the lock detector circuit 200 when the signals are out of the phase but within the window of tolerance. Diagrams 502 and 504 represent the reference signal 102 and the feedback signal respectively. Diagram 506 shows that the amount of phase difference between the reference signal 102 and the feedback signal 104 is within the window of tolerance set by the delay circuits 206 and 208. Diagram 510 is the output of the first D flip flop 210 and diagram 512 is the output of the second flip flop 212. Both of the outputs 510 and 512 are LOW. As a result, the output of the OR gate 214 is LOW as illustrated in diagram 514.

Thus, FIGS. 3 to 5 show that the lock detector 200 continue to reset the divide-by-64 counters 216 and 218 when the two signals 102 and 104 are not in-phase or within the window of tolerance as illustrated in a set of diagrams 300. The divide-by-64 counters 216 and 218 are repeatedly reset and no lock condition is indicated. But when the two signals 102 and 104 are either in-phase as illustrated in a set of diagrams 400 in FIG. 4 or within the window of tolerance as illustrated by the set of diagrams 500 in FIG. 5, the output of the logic gate 214 enables the divide-by-64 counters 216 and 218. The divide-by-64 counters 216 and 218 start to count to full cycle and set HIGH. As a result, the AND gate 220 goes HIGH, asserting that a locked relation has been achieved.

Referring to FIG. 6, the flow chart 600 of the method of detecting lock of the reference signal and the feedback signal is shown.

At step 602, the method begins by receiving the reference signal and the feedback signal from a PLL system.

Step 604 determining a window of tolerance for the reference signal and the feedback signal by an amount ΔT less than half of the period T of each signal. The delay amount ΔT defines the window of tolerance within which a lock condition is still achieved.

Step 606 consists of determining whether the reference signal and the feedback signal are in lock condition. This step can be realized by cross clocking a delayed reference signal and a delayed feedback signal. The delayed reference signal is clocked by the positive-going transitions (PGT) of the feedback signal and the delayed feedback signal is clocked by the positive-going transitions (PGT) of the reference signal.

Step 608 consists of determining whether the outputs of the cross-clocking have the same value.

Whenever the cross clocking is detected to have a HIGH value or the outputs have different values, such as one LOW and one HIGH, the reset to the divide-by-64 is HIGH, go to step 612. Step 612 consists of stopping and repeatedly resetting the counters and producing no lock condition at step 614. Next, repeat step 602 to step 612 as long as the output of the cross clocking is detected to have different values.

Otherwise at step 614, when the outputs of the cross clocking have the same value, asserting the clock condition by the following steps. At step 616, the lock detector circuit 200 checks the counters 216 and 218 whether they both have their counts equal to N−1. If both counters 216 and 218 have full N−1 counts and the reset is not HIGH, the process goes to step 626 to signal lock indicator for being ON. If both counters 216 and 218 do not have full N−1 counts at step 618, the counters start the counting with the initial count value being zero. At step 620, the divide-by-N counters 216 and 218 increase the clock count by an incremental amount of 1. At step 622, the lock detector 200 checks again whether the counters 216 and 218 have reached their full counts. If both counters 216 and 218 have not reached their full counts, the method goes to step 624 to check if the reset value is still low or the outputs of the cross clocking have the same value. If it is still low, the process continues at step 620, and counting up until the count equals to N−1 and goes to step 626 to signal that lock conditions has been achieved. At step 624, if the reset value is not low or the outputs of the cross clocking are no longer the same, e.g., when the system 100 is knocked out of lock by a noise spike during the counting period of the counters 216 and 218, the process goes to step 612 to reset the counters and goes to step 614 to signal that the system is out of lock again. At step 626, after the lock indication is ON, the method continues to check "lock condition" by repeating steps 604 to 626.

What is claimed is:

1. A lock detector circuit for detecting a lock condition for a phase locked loop circuit, comprising:
    (a) a means adapted to receive a reference signal and a feedback signal of the phase locked loop circuit for setting a window of tolerance;
    (b) a pair of cross-clocked latches coupled to the means for setting the window of tolerance for determining whether the phase locked loop circuit is in lock condition;
    (c) a logic gate coupled to outputs of the pair of cross-clocking latches circuit; and
    (d) a plurality of counters coupled to an output of the logic gate for asserting the lock condition.

2. The lock detector of claim 1 further comprising an output gate for delivering the lock signal upon receipt of lock signals from all the plurality of counters.

3. The lock detector of claim 1, wherein the cross-clocked latches comprises:
    (a) a first latching means having an input terminal, an output terminal and a clock terminal, wherein the first latching means is adapted to receive the reference signal delayed by an amount equaled to the window of tolerance at the input terminal and the feedback signal at the clock terminal; and
    (b) a second latching means having an input terminal, an output terminal and a clock terminal, wherein the second latching means is adapted to receive the feedback signal delayed by an amount equaled to the window of tolerance at the input terminal and the reference signal at the clock terminal.

4. The lock detector of claim 3, wherein the first latching means is a D flip flop and the second latching means is a second D flip flop.

5. The lock detector of claim 1, wherein the plurality of counters comprising a first divide-by-N counter and a second divide-by-N, each divide-by-N counter having an input terminal, an output terminal, and a reset terminal.

6. The lock detector of claim 5, wherein each divide-by-N counter is a divide-by-64 counter.

7. The lock detector of claim 1, wherein the logic gate is an OR gate.

8. The lock detector of claim 1, wherein the logic gate is an exclusive-OR gate.

9. A lock detector circuit for detecting lock condition for a phase locked loop circuit, comprising:
    (a) a first delay means for setting a window of tolerance for the reference signal;
    (b) a second delay means for setting a window of tolerance for the feedback signal;
    (c) a first D flip flop having an input terminal, an output terminal and a clock terminal, wherein the first D flip flop receiving an output of the first delay circuit at the input terminal and the feedback signal at the clock terminal;
    (d) a second D flip flop having an input terminal, an output terminal and a clock terminal, wherein the second D flip flop receiving an output of the second delay circuit at the input terminal and the reference signal at the clock terminal;
    (e) a first divide-by-64 counter having an input terminal coupled to the reference signal, an output terminal, and a reset terminal;
    (f) a second divide-by-64 counter having an input terminal receiving the feedback signal, an output terminal, and a reset terminal;
    (g) a logic gate having a first input terminal, a second input terminal and an output terminal, wherein the first input terminal being coupled to the output terminal of the first D flip flop, the second input terminal being coupled to the output of the second D flip flop, and the output terminal being coupled to the reset terminals of the first divide-by-64 counter and the second divide-by-64 counter; and
    (h) an AND logic gate receives the outputs of both the divide-by-64 counters.

10. A method for detecting lock between a reference signal and a feedback signal of a phase locked loon circuit, comprising the following steps:
    (a) determining a window of tolerance for the reference signal and the feedback signal;
    (b) determining whether the reference signal and the feedback signal are in lock condition by
        (1) cross-clocked latching a delayed reference signal and a delayed feedback signal; wherein the delayed reference signal is clocked by a positive-going transition (PGT) of the feedback signal, and the delayed feedback signal is clocked by a positive-going transition (PGT) of the reference signal; and
        (2) determining whether outputs of the cross-clocked latching step has the same value;
    (c) asserting the lock condition; wherein whenever the outputs of the cross-clocked latching step has the same value, producing a lock detection signal, and repeating steps (a) to (c); and whenever the outputs of the cross-clocked latching step has different values, producing an unlock detection signal and repeating steps (a) to (c).

11. The method of claim 10, wherein the step of asserting the lock condition further comprising:

(i) determining whether a full cycle has been reached;

(ii) producing a lock signal and repeating steps (a) to (c) of claim 10 whenever the full cycle has been reached;

(iii) determining whenever the outputs of the cross-clocked latching step still have the same value whenever the full cycle has not been reached;

(iv) producing the unlock signal and repeating steps (a) to (c) of claim 10 whenever the output of the cross-clocked latching step are no longer have the same values; and (v) incrementing the count by one, continuing dividing the frequencies, and repeating steps (i) through (v) whenever the output of the cross-clocked signal still have the same value.

* * * * *